(12) United States Patent
Choo et al.

(10) Patent No.: US 6,528,819 B2
(45) Date of Patent: Mar. 4, 2003

(54) METHOD OF FABRICATING AN ARRAY SUBSTRATE FOR AN X-RAY DETECTOR

(75) Inventors: Kyo-Seop Choo, Seoul (KR); June-Ho Park, Kyoungsangbuk-do (KR)

(73) Assignee: LG. Philips LCD Co., Ltd., Seoul (KR)

(*) Notice: Subject to any disclaimer, the term of this patent is extended or adjusted under 35 U.S.C. 154(b) by 0 days.

(21) Appl. No.: 09/788,588

(22) Filed: Feb. 21, 2001

(65) Prior Publication Data

US 2001/0049154 A1 Dec. 6, 2001

(30) Foreign Application Priority Data

Feb. 21, 2000 (KR) .............................................. 00-8332

(51) Int. Cl.[7] .......................... H01L 29/04; H01L 31/20; H01L 31/036; H01L 31/0376
(52) U.S. Cl. .............................. 257/59; 257/57; 257/222
(58) Field of Search .............................. 257/59, 57, 66, 257/68, 222, 72, 296, 300, 350; 438/48, 56, 57, 73

(56) References Cited

U.S. PATENT DOCUMENTS

| | | | | |
|---|---|---|---|---|
| 5,828,433 A | * | 10/1998 | Shin | 349/147 |
| 6,310,669 B1 | * | 10/2001 | Kobayashi et al. | 349/43 |
| 6,403,980 B1 | * | 6/2002 | Park | 257/59 |

* cited by examiner

Primary Examiner—Olik Chaudhuri
Assistant Examiner—Theresa T. Doan
(74) Attorney, Agent, or Firm—McKenna Long & Aldridge LLP

(57) ABSTRACT

An array substrate for use in an X-ray sensing device is fabricated using an etching stopper that enables good control of the etching process, and an electrode that prevents damage caused by static electricity generated during a dry-etching step. During fabrication, the array substrate includes a plurality of gate lines that are all electrically connected to an electrode pattern via gate line extensions and gate line contact holes. The electrode pattern causes the gate lines to have equipotentials, which reduces static electricity induced defects.

9 Claims, 6 Drawing Sheets

METHOD OF FABRICATING AN ARRAY SUBSTRATE FOR AN X-RAY DETECTOR

CROSS REFERENCES TO RELATED APPLICATIONS

This application claims the benefit of Korean Patent Application No. 20002-8332, filed on Feb. 21, 2000, which is hereby incorporated by reference for all purposes as if fully set forth herein.

BACKGROUND OF THE INVENTION

1. Field of the Invention

The present invention relates to X-ray detectors. More particularly, it relates to Thin Film Transistor (TFT) array substrates for use in X-ray detectors.

2. Description of Related Art

A widely used method of medical diagnosis is the X-ray film. As such films produce photographic images, time consuming film-processing procedures are required to obtain the results. However, digital X-ray sensing devices (referred to hereinafter as X-ray detectors) that employing thin film transistors have been developed. Such X-ray sensing devices have the advantage of providing real time diagnosis.

FIG. 1 is a cross-sectional view illustrating one pixel of an array substrate of a related art X-ray detector. That X-ray sensing device includes a Thin Film Transistor (TFT) "T" on a substrate 1, a photoconductive film 2, and various conductive elements that are described subsequently. Also included, but not shown in FIG. 1, are a scanning integrated circuit and a data integrated circuit.

Still referring to FIG. 1, the photoconductive film 2 produces electron-hole pairs 6 in proportion to the strength of incident radiation, such as X-rays. Thus, the photoconductive film 2 acts as a photoelectric transducer that converts incident X-rays into electron-hole pairs 6. An external voltage Ev is applied across a conductive electrode 7 and a pixel electrode 62. That voltage causes the electron-hole pairs 6 in the photoconductive film 2 to separate such that X-ray induced electrical charges accumulate on the pixel electrode 62. Those electrical charges are applied to a second capacitor electrode 60, and are consequently stored in a storage capacitor "S" formed by the second capacitor electrode 60 and a first capacitor electrode 58 that is formed over a ground line 42. The pixel electrode 62, the first capacitor electrode 58 and the second capacitor electrode 60 are beneficially comprised of a transparent conductive material such as Indium-Tin-Oxide (ITO). Furthermore, an insulating dielectric layer 15 is interposed between the first capacitor electrode 58 and the second electrode 60. That dielectric layer is beneficially comprised of Silicon Nitride ($SiN_x$).

Still referring to FIG. 1, the TFT "T" connects to the storage capacitor "S" such that electrical charges accumulated on the storage capacitor "S" can flow through the TFT "T" and into the data integrated circuit (not shown) when the TFT "T" is turned ON by the scanning integrated circuit (not shown).

FIG. 2 is a plan view illustrating several pixels of an array substrate for an X-ray detector according to the conventional art. Gate lines 50 are arranged in a transverse direction and data lines 53 are arranged in a longitudinal direction. Gate pads 87 are formed at each end of each gate line 50. Those gate pads 87 are associated with gate pad contact holes 96. The gate pads 87 also connect to a gate shorting bar (not shown) that makes the gate pads have equipotentials. The gate pads 87 are classified into even number gate pads and odd number gate pads when performing short/open-circuit testing. An etch stopper 59 is formed over the gate pads 87.

A TFT "T" is formed near each crossing of the gate and data lines 50 and 53 (for simplicity only one TFT "T" is shown in detail in FIG. 2). Each TFT acts as a switching element. A ground line 42 is arranged perpendicular to the gate lines 50. That ground line crosses a storage capacitor region "S". The ground line 42 acts as a common line for neighboring pixels.

A first capacitor electrode 58 and a second capacitor electrode 60 of a storage capacitor "S" are located in each pixel area, with the pixel areas being the regions between the gate lines and the data lines. Additionally, as shown in FIG. 1, but not shown in FIG. 2, a dielectric layer 15 of Silicon Nitride ($SiN_x$) is interposed between first capacitor electrodes 58 and the second capacitor electrodes 60. Pixel electrodes 62 that extend over the TFTs "T" are then located in the pixel areas. Although not shown in FIG. 2, but as shown in FIG. 1, in order to store the holes which are generated in the photoconductive film 2, each pixel electrode 62 electrically connects to the second capacitor electrode 60 of that pixel. Furthermore, each pixel electrode 62 is electrically connected to a drain electrode 33 of that pixel's TFT "T" via a drain contact hole 85.

The fabrication steps of the array substrate illustrated in FIG. 2 will be explained with reference to FIGS. 3A to 3E, which are cross-sectional views taken along lines I—I, II—II and III—III.

Referring to FIG. 3A, a first metal layer is formed on a substrate 71 by depositing a metallic material such as Aluminum (Al), Al-alloy, Molybdenum (Mo), Tantalum (Ta), Tungsten (W), Niobium (Nb) or Antimony (Sb). A gate line (not shown), a gate electrode 73 that extends from the gate line, and gate pads 87 on each end of the gate line are then formed by patterning the first metal layer. Simultaneously formed are a shorting bar (not shown) and a shorting bar connector (also not shown) that connects the gate pads to the shorting bar. Then, a first insulation layer 75 is deposited over the substrate 71 and over the first patterned metal layer. The first insulation layer 75 can be comprised of an inorganic substance, such as Silicon Nitride ($SiN_x$) or Silicon Oxide ($SiO_x$), or of an organic substance such as BCB (Benzocyclobutene) or an acryl. Silicon Nitride ($SiN_x$) is assumed to be employed hereinafter.

As shown in FIG. 3B, a pure amorphous silicon (a-Si:H) layer and a doped amorphous silicon ($n^+$ a-Si:H) layer are sequentially formed over the first insulation layer 75. Those silicon layers are then patterned to form an active layer 86 and an ohmic contact layer 91. CVD (Chemical Vapor Deposition) or the Ion Injection Method is beneficially used to form the doped amorphous silicon layer.

Referring now to FIG. 3C, a source electrode 32, a drain electrode 33, and a ground line 42 are then formed. First, a second conductive metal layer is deposited. The second conductive metal layer is then patterned to form the source electrode 32, which extends from the data line (reference element 53 of FIG. 2) over the gate electrode 73; the drain electrode 33, which is spaced apart from the source electrode 32 and over the gate electrode 73; and the ground line 42, which crosses under the storage capacitor "S" (see FIG. 2). A portion of the ohmic contact layer 91 on the active layer 86 is then etched to form a channel region using the source and drain electrodes 32 and 33 as masks. Thus, the TFT "T" (see FIG. 2) is complete.

Next, the first capacitor electrode 58 and the etch stopper 59 are respectively formed over the ground line 42 and over the gate pads 87 by depositing and patterning a transparent conductive material such as Indium-Tin-Oxide (ITO). The first capacitor electrode 58 is in electrical contact with the ground line 42. The etch stopper 59, as shown in FIG. 2, is arranged in a longitudinal direction while overlapping the gate pads 87. A dielectric protection layer 81 is then formed over the TFT, over the first capacitor electrode 58, over the etch stopper 59, and over the first insulation layer 75 by depositing Silicon Nitride ($SiN_x$). Thus, the first insulation layer 75 and the protection layer 81 are stacked over the gate pads 87. The protection layer 81 also protects the TFT.

A second capacitor electrode 60, which corresponds in size to the first capacitor electrode 58, is then formed on the protection layer 81 and over the first capacitor electrode 58. The second capacitor electrode 60 is beneficially comprised of transparent conductive material such as Indium-Tin-Oxide (ITO) or Indium-Zinc-Oxide (IZO). A second insulation layer 83 is then formed, beneficially by depositing an organic substance such as BCB (Benzocyclobutene). BCB is a good choice because it has a low dielectric permittivity.

FIG. 3D shows a step of forming contact holes. The second insulation layer 83 and the protection layer 81 are etched to form a drain contact hole 85 over the drain electrode 33. Simultaneously, a capacitor electrode contact hole 95 is formed by etching the second insulation layer 83 over the second capacitor electrode 60. Also simultaneously, by etching the second insulation layer 83 and the protection layer 81, an etch stopper contact hole 97 over the etch stopper 59 is formed.

In order to form each contact hole, the dry-etching method is used. When performing the dry-etching method the dry-etch generates static electricity. The etch stopper 59 and the gate pads 87 are especially easy to charge with the static electricity. Charged gate pads can cause gate line defects. For example, electric charge on the gate pads 87 are readily conveyed to the gate lines, wherein they can accumulate until a static discharge occurs, destroying a gate line and causing an open circuit.

Referring now to FIG. 3E, a pixel electrode 62, which connects to the drain electrode 33 via the drain contact hole 85, and to the second capacitor electrode 60 via the capacitor electrode contact hole 95, is formed by depositing and patterning a transparent conductive material such as ITO (indium-tin-oxide) or IZO (indium-zinc-oxide). Since the pixel electrode 62 is conductive, the pixel electrode 62 and the second capacitor electrode 60 have equipotentials. When forming the pixel electrode 62, the etch stopper 59 (see FIG. 3D) over the gate pads 87 is etched. Then, gate pad contact holes 96 over the gate pads 87 are formed by etching the first insulation layer 75.

With respect to the above-mentioned processes, the reason for forming the etch stopper is to control the etch ratio when forming the contact holes. A more detailed explanation is now provided. When dry etching, the etching process is controlled by monitoring a gas that is produced by a chemical reaction between the etching gas and the insulation or protection layers using an electrical device, referred to as an EPD (end point detector). The EPD converts the amount of the produced gas to an electrical voltage. Thus, the duration of the etching can be controlled based upon the electrical voltage. However, it is difficult to accurately control the etching process. Referring now to FIGS. 3D and 3E, as noted, the drain contact hole 85 is formed by etching the second insulation layer 83 and the protection layer 81, and the capacitor electrode contact hole 95 is formed by etching the second insulation layer 83. Additionally, if the etching stopper 59 was not formed on the first insulation layer 75, the gate pad contact holes 96 would be formed by etching the second insulation layer 83, the protection layer 81 and the first insulation layer 75. Furthermore, all those openings would be etched at the same time. Thus, the drain electrode 33 and the second capacitor electrode 60 would likely be over-etched while forming the data pad contact holes 96. Therefore, the etch stopper 59 is formed on the first insulation layer 75 and over the gate pads 87 to enable more controlled etching.

While generally successful, some problems occur when practicing the above-mentioned process. For example, during fabrication, a significant amount of electric charge is stored during dry etching in a capacitor comprised of the first insulation layer 75, the etch stopper 59, and the gate pads 87. As previously explained, the stored charge can damage the gate lines, reducing the throughput and yield of the X-ray detector.

SUMMARY OF THE INVENTION

This invention has been developed in order to address the above-described problem.

An object of this invention is to provide an array substrate for use in an X-ray sensing device. Furthermore, it is an object of the present invention to reduce open gate lines caused by static electricity.

Additional features and advantages of the invention will be set forth in the description that follows, and in part will be apparent from that description, or may be learned by practice of the invention. The objectives and other advantages of the invention will be realized and attained by the structure particularly pointed out in the written description and claims hereof as well as the appended drawings.

In order to accomplish at least one of the above objects, the principles of the present invention provide a method of fabricating an array substrate for use in an X-ray sensing device. The method includes forming a plurality of gate lines on a substrate, with the gate lines each having a gate electrode, a gate line extension and a gate pad. Then forming a first insulation layer on the gate line, on the gate electrode, on the gate line extension, on the gate pad and on the substrate. Next, forming first and second gate line contact holes to the gate line extension by patterning the first insulation layer. The method continues by forming a semiconductor layer on the first insulation layer and over the gate electrode, with the semiconductor layer including an active layer and an ohmic contact layer. Next, forming source and drain electrodes, a data line and a ground line, with the source and drain electrodes extend over the active layer, with the data line electrically connected to the source electrode, with the gate line and the data line defining a pixel region, and with the ground line crossing the pixel region. Next, forming a thin film transistor (TFT) near the crossing of the gate and data lines, with the TFT being comprised of the gate electrodes, the data electrode, the drain electrode and the semiconductor layer. Next, forming a first capacitor electrode, a plurality of island-shaped transparent electrode patterns, and an etch stopper, with the first capacitor electrode electrically contacting the ground line, with the electrode patterns formed over the gate line extensions and electrically contacting a pair of gate extensions via the first and second gate line contact holes, and with the etch stopper located over the plural gate pads. Then, forming a protection layer on the thin film transistor, on the first capacitor electrode, on the island-shaped transparent electrode patterns and on the etch stopper. Next, forming a second capacitor electrode on the protection layer and over the first capacitor electrode. Next, forming a storage capacitor in the pixel region, with the storage capacitor being comprised of the first capacitor electrode, the second capacitor electrode, and the protection layer. The method continues by forming a second insulation layer on the protection layer and on the second capacitor electrode. Then, forming an etching hole and an etch stopper contact hole, which respectively expose the island-shaped transparent electrode pattern and the etch stopper, by etching the second insulation layer and the protection layer. Then, etching the etch stopper and the portion of the island-shaped transparent electrode pattern.

A method of fabricating an array substrate further includes the step of forming a drain contact hole by etching the second insulation layer and the protection layer to expose the drain electrode. The method also includes the step of forming a capacitor electrode contact hole by etching the second insulation layer to expose the second capacitor electrode.

The drain contact hole, the capacitor electrode contact hole, the etching hole, and the etch stopper contact hole are beneficially formed in the same etching step.

A method of fabricating an array substrate further includes depositing a conductive material on the second insulation layer, in the drain contact hole, and in the capacitor electrode contact hole, and then patterning the conductive material to form a pixel electrode that electrically connects to the drain electrode and to the second capacitor electrode.

Beneficially, the first insulation layer is made of a material selected from a group consisting of Silicon Nitride (SiNx), Silicon Oxide (SiOx), BCB (Benzocyclobutene) and an acryl. The first capacitor electrode, the second capacitor electrodes, and the pixel electrode are made of a transparent conductive material such as Indium-Tin-Oxide (ITO) or Indium-Zinc-Oxide (IZO).

The protection layer is beneficially of Silicon Nitride (SiNx) and the second insulation layer is beneficially of BCB (Benzocyclobutene). The gate line extension beneficially extends from the gate line in a longitudinal direction, and the width of the gate line extension is wider than that of the gate line.

In order to accomplish the above objects, the principles of the present invention further provide for an array substrate. That array substrate includes a plurality of gate lines on a substrate, with each gate line having at least one gate electrode, a gate line extension and at least one gate pad. The array substrate further includes a first insulation layer is over the gate lines, over the gate electrodes, over the gate line extensions, and over the substrate. Additionally, a plurality of gate line contact holes pass through the first insulation to the gate line extensions. A plurality of thin film transistors are on the first insulation layer, each thin film transistor being located over a gate electrode and having a source electrode, a drain electrode, and a semiconductor layer. A plurality of data lines are also on the first insulation layer, each data line electrically contacting to a plurality of source electrodes and crossing over a plurality of gate lines to define a plurality of pixel regions. A ground line extends under each pixel region, with the ground line being on the first insulation layer. A first capacitor electrode is disposed over the ground line and over a portion of the first insulation layer. The first capacitor electrode electrically connects to the ground line. The first capacitor electrode is comprised of a transparent conductive material. A plurality of island-shaped transparent electrode patterns are disposed over the gate line extensions, with each island-shaped transparent electrode pattern contacting a pair of the gate line extensions via the first and second gate line contact holes. An etch stopper is disposed on the first insulation layer over the gate pads. A protection layer is disposed over the thin film transistor, over the first capacitor electrode, over the island-shaped transparent electrode pattern, and over the etch stopper. A second capacitor electrode is disposed on the protection layer and over the first capacitor electrodes. A second insulating layer is disposed over the protection layer and over the second capacitor electrodes. A plurality of etching holes pass through the second insulation layer and through the protection layer to the island-shaped transparent electrode pattern. Additionally, etch stopper contact holes pass through the second insulation layer and through the protection layer to the etch stopper.

An array substrate in accord with the principles of the present invention can further include a capacitor electrode contact hole through the second insulation layer that extends to the second capacitor electrode. Additionally, a drain electrode contact hole through the second insulation layer and through the protection layer extends to a first drain electrode of the plurality of drain electrodes.

An array substrate in accord with the principles of the present invention can further includes a pixel electrode that electrically contacts the drain electrode through the drain electrode contact hole.

It is to be understood that both the foregoing general description and the following detailed description are exemplary and explanatory and are intended to provide further explanation of the invention as claimed.

BRIEF DESCRIPTION OF THE DRAWINGS

For a more complete understanding of the present invention and the advantages thereof, reference is now made to the following description taken in conjunction with the accompanying drawings, in which like reference numerals denote like parts, and in which.

DETAILED DESCRIPTION OF ILLUSTRATED EMBODIMENTS

Reference will now be made in detail to illustrated embodiments of the present invention, examples of which are shown in the accompanying drawings.

Figure 1:
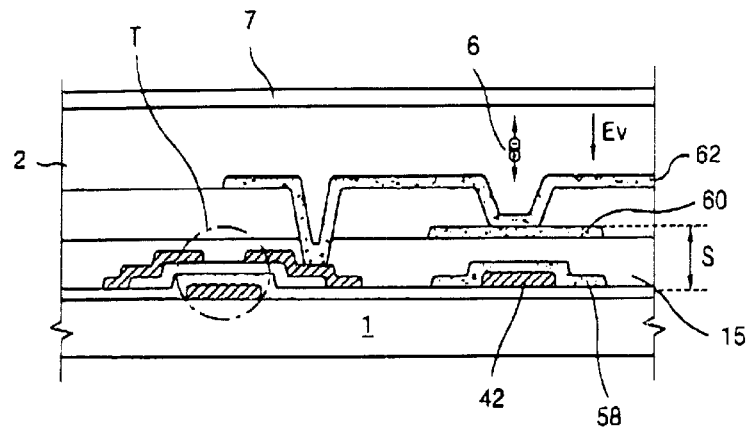
FIG. 1 is a cross-sectional view of one pixel of a conventional X-ray sensing device.
Figure 2:
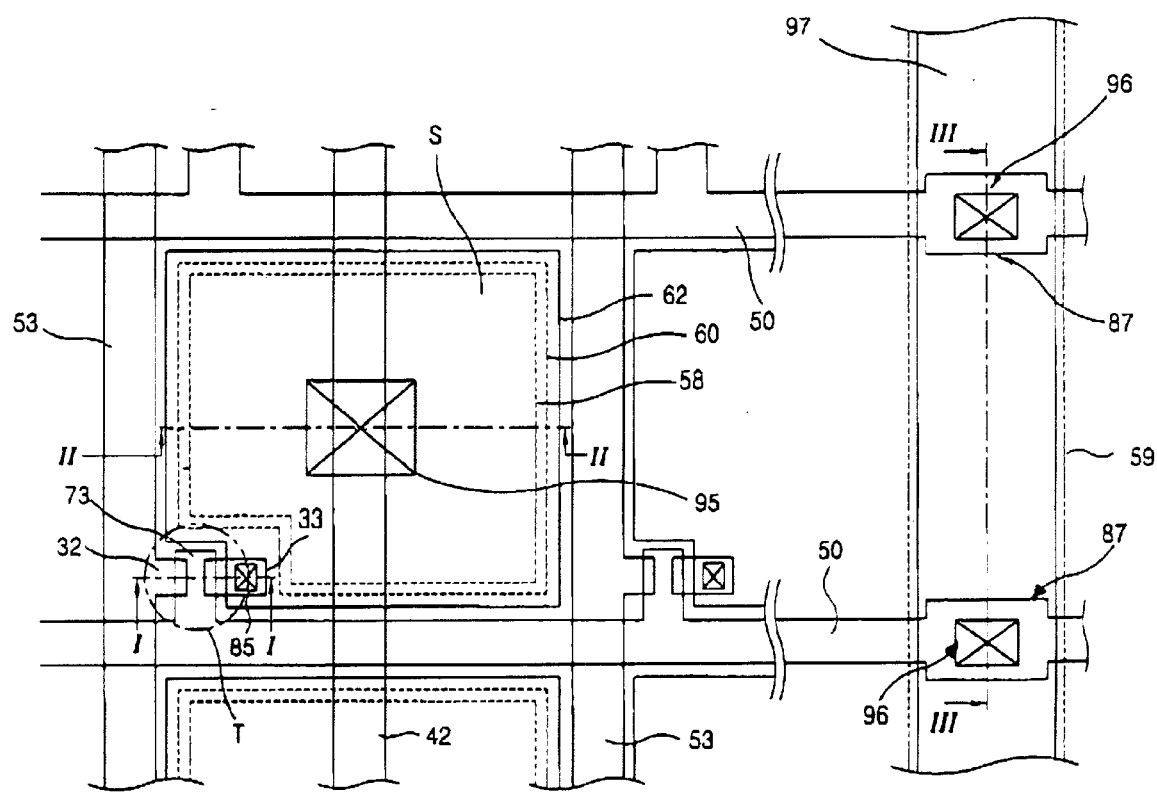
FIG. 2 is a plan view of a conventional array substrate having pixels as in FIG. 1.
Figure 3A:
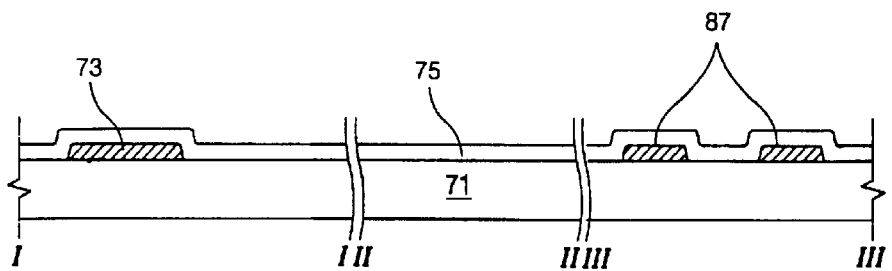
FIGS. 3A to 3E are cross sectional views taken along lines I—I, II—II and III—III of FIG. 2 and help illustrate the manufacturing steps for that array substrate.
Figure 3B:
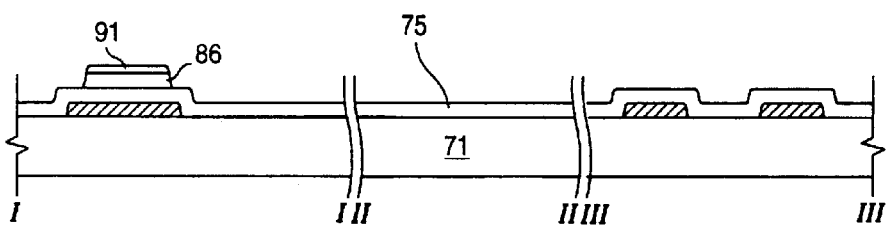
Figure 3C:
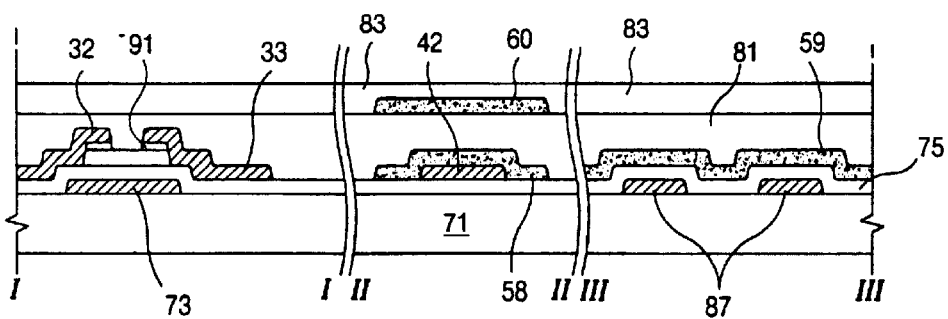
Figure 3D:
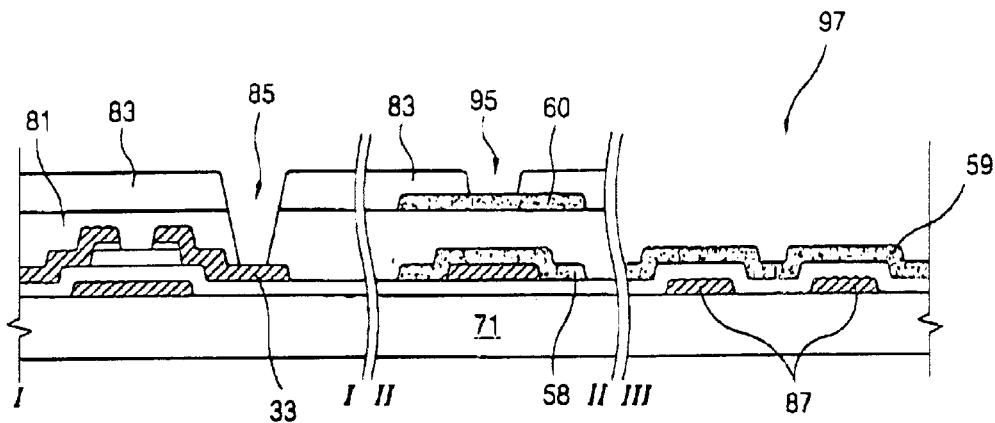
Figure 3E:
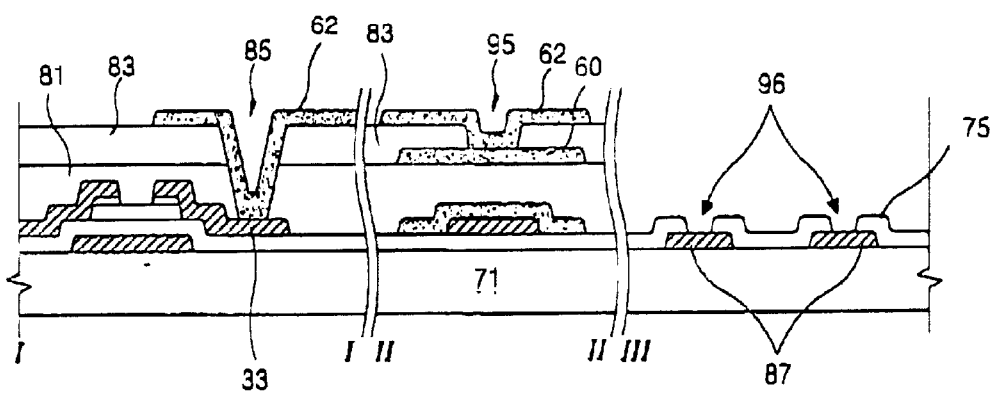
Figure 4:
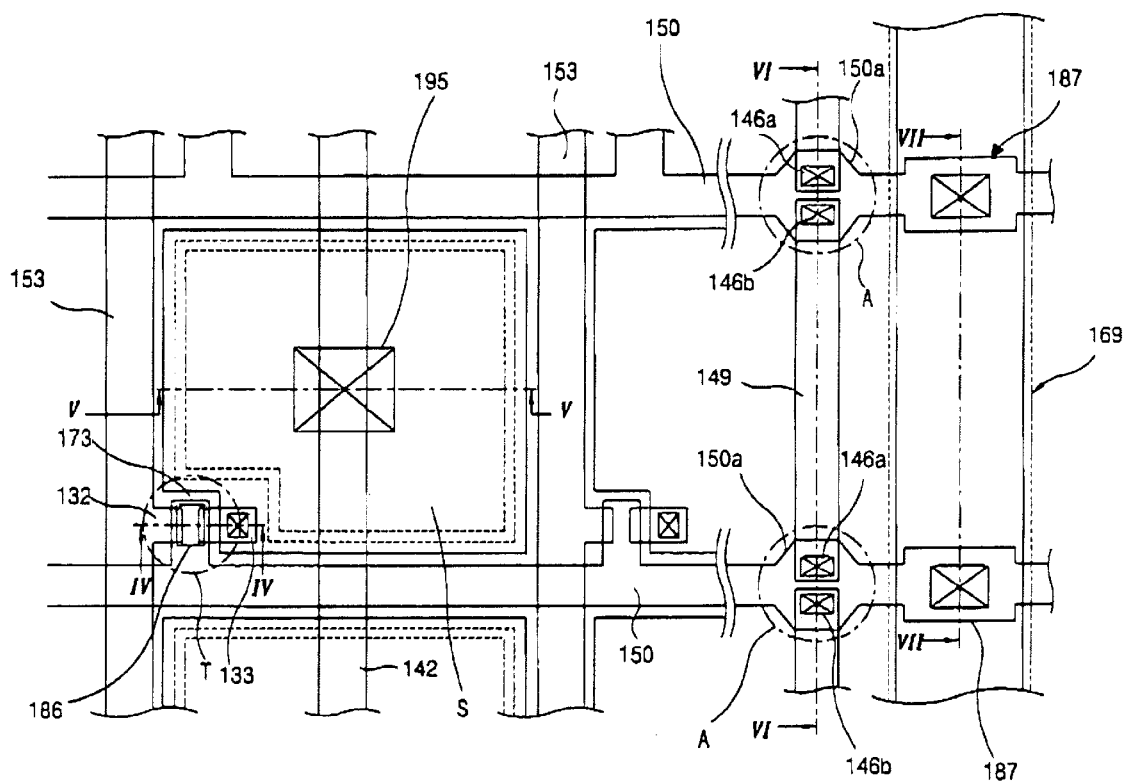
FIG. 4 is a partial plan view of an array substrate for use in an X-ray detector that is in accord with the principles of the present invention.

FIG. 4 is a partial plan view of an array substrate for use in an X-ray detector and that is in accord with the principles of the present invention. As shown in FIG. 4, gate lines 150 and data lines 153 cross each other and define a storage capacitor area "S." A TFT "T" is positioned near the crossing of a gate line 150 and a data line 153. A ground line 142 in parallel with the data lines 153 passes underneath the storage capacitor "S." The TFT "T" includes a gate electrode 173 that is extended from a gate line 150, a semiconductor layer 186, a source electrode 132 that is extended from a data line 153 and overlaps one end of the gate electrode 173, and a drain electrode 133 that is spaced apart from the source electrode 132 and overlaps the other end of the gate electrode 173.

Moreover, an elongated gate line extension 150a is formed in the dotted area "A" of each gate line 150. The gate line extension 150a has first and second gate line contact holes 146a and 146b. An island-shaped transparent electrode pattern 149 electrically contacts the gate lines 150 via the first and second gate line contact holes 146a and 146b. The island-shaped transparent electrode patterns 149 ensure that the gate lines 150 have equipotentials. An etch stopper 169 is located over gate pads 187. The etch stopper 169 is formed perpendicular to the gate lines 150.

The fabrication steps of the array substrate illustrated in FIG. 4 will be explained with reference to FIGS. 5A to 5F, which are cross-sectional views taken along lines IV—IV, V—V, VI—VI and VII—VII of FIG. 4.

Figure 5A:
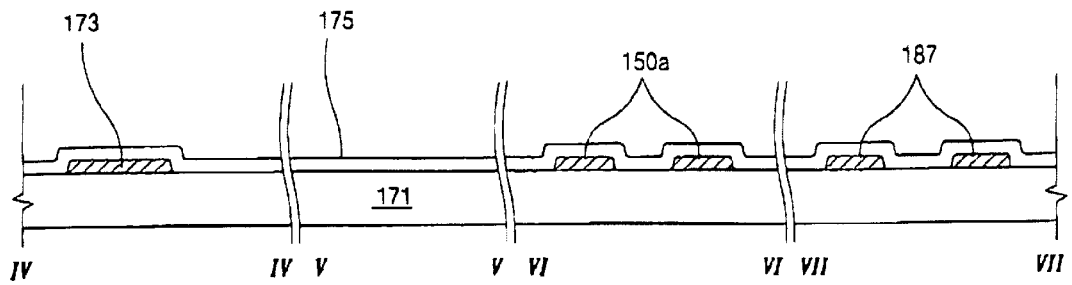
FIGS. 5A to 5F are cross sectional views taken along lines IV—IV, V—V, VI—VI and VII—VII of FIG. 4 and help illustrate the manufacturing steps for that array substrate.

Referring now to FIG. 5A, a first metal layer is formed on a substrate 171 by depositing a metallic material such as Aluminum (Al), Al-alloy, Molybdenum (Mo), Tantalum (Ta), Tungsten (W) or Antimony (Sb). The first metal layer is patterned to form gate lines 150 (see FIG. 4) and a gate electrode 173 that extends from a gate line 150. Additionally, a gate pad 187 is formed at the ends of each of the gate lines 150 by patterning the first metal layer. Moreover, gate line extensions 150a, which are electrically connected to the gate pads 187, are formed in a predetermined area near the gate pads 187. After the first metal layer is patterned, a first insulation layer 175 is formed on the substrate 171 and over the patterned first metal layer. Beneficially, the first insulation layer 175 is an inorganic substance such as Silicon Nitride (SiNx) or Silicon Oxide (SiOx), or an organic substance such as BCB (Benzocyclobutene) or an acryl. Silicon Nitride (SiNx) is beneficially employed in the embodiment of FIG. 4.

Figure 5B:
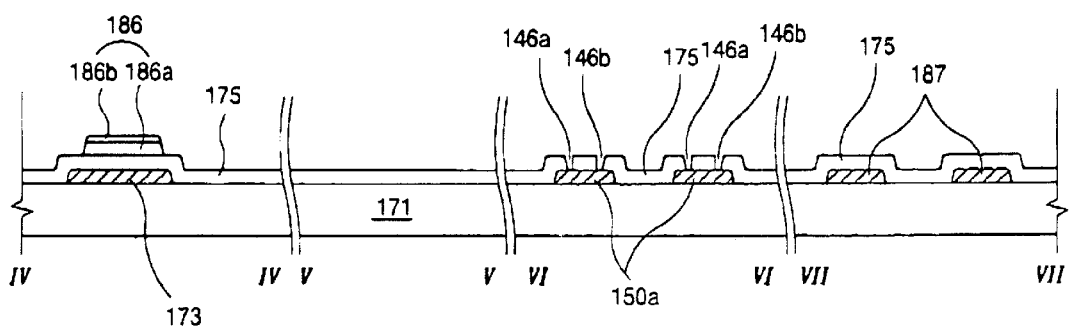

Referring now to FIG. 5B, the first insulation layer 175 is patterned to form the first and second gate line contact holes 146a and 146b that expose the gate line extensions 150a. A pure amorphous silicon (a-Si:H) layer and a doped amorphous silicon (n+ a-Si:H) layer are then sequentially formed over the first insulation layer 175. Those silicon layers are then patterned to form a semiconductor layer 186 including an active layer 186a and an ohmic contact layer 186b. Either CVD (Chemical Vapor Deposition) or an Ion Injection Method is beneficial in forming the doped amorphous silicon layer.

Figure 5C:
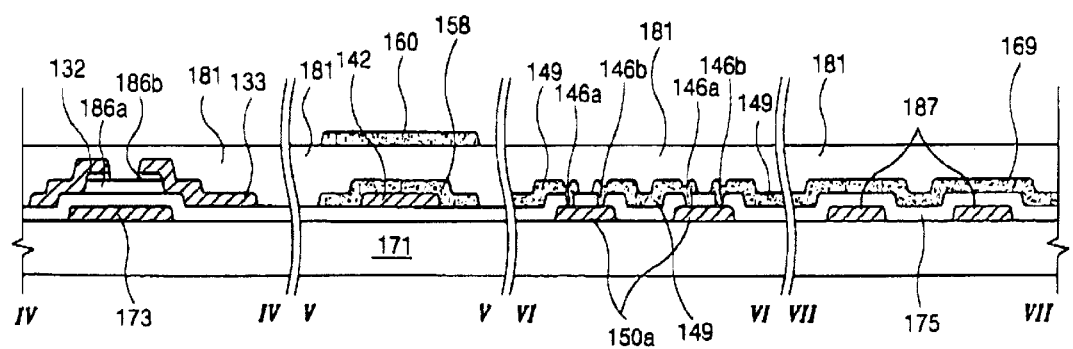

Referring now to FIG. 5C, a source electrode 132, a drain electrode 133, and a ground line 142 are then formed. First, a second conductive metal layer is deposited. That second conductive metal layer is then patterned to form the source electrode 132, the drain electrode 133, and the ground line 142. Referring now to both FIG. 4 and FIG. 5C, the source electrode 132 is formed over the gate electrode 173 as an extension of the data line 153. The drain electrode 133 is formed over part of the gate electrode 173 and spaced apart from the source electrode 132. The ground line 142 crosses under the storage capacitor area "S." A portion of the ohmic contact layer 186b on the active layer 186a is then etched to form a channel region using the source and drain electrodes 132 and 133 as masks. Thus, the TFT "T" (see FIG. 4) is completed.

Still referring to FIG. 5C, a first capacitor electrode 158 is then formed on the ground line 142 by depositing and patterning a transparent conductive material such as Indium-Tin-Oxide (ITO). As shown, the first capacitor electrode 158 is in contact with the ground line 142. When forming the first capacitor electrode 158, an etch stopper 169 is simultaneously formed on the first insulation layer 175 and over the plural gate pads 187 using the transparent conductive material. Thus, the etch stopper 169 overlaps the gate pads 187. Moreover, when forming the first capacitor electrode 158, the island-shaped transparent electrode patterns 149 are formed on the first insulation layer 175. Each electrode pattern 149 contacts a gate line extension 150a via the first gate line contact hole 146a, and also contacts the other adjacent gate line extension 150a via the second gate line contact hole 146b. Thus, each island-shaped transparent electrode pattern 149 links two gate line extensions 150a such that every gate line 150 (see FIG. 4) is electrically connected to the other gate lines. The island-shaped transparent electrode patterns reduces the occurrence of static electricity discharge because the transparent electrode patterns causes the plural gate lines to have equipotentials.

Still referring to FIG. 5C, a Silicon Nitride $(SiN_x)$ dielectric protection layer 181 is then formed over the TFT "T," over the first capacitor electrode 158, over the etching stopper 169, over the island-shaped transparent electrode patterns and over the first insulation layer 175. A second capacitor 160 that corresponds in size to the first capacitor electrode 158 is then formed on the protection layer 181 over the first capacitor electrode 158. Beneficially, the second capacitor electrode 160 is comprised of the same material as the first capacitor electrode 158.

Figure 5D:
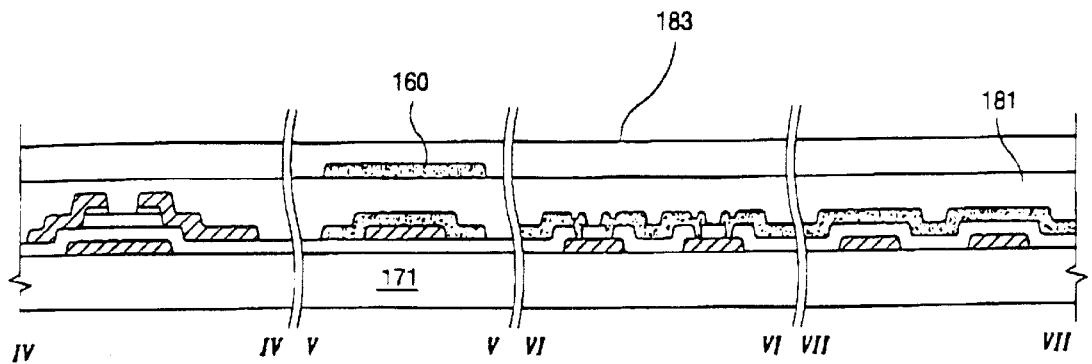

Referring now to FIG. 5D, a second insulation layer 183 is formed on the protection layer 181 and over the second capacitor electrode 160, beneficially by depositing an organic substance such as BCB (Benzocyclobutene). BCB has a lower dielectric permittivity than Silicon Nitride $(SiN_x)$, Silicon Oxide $(SiO_x)$, and an acryl.

Figure 5E:
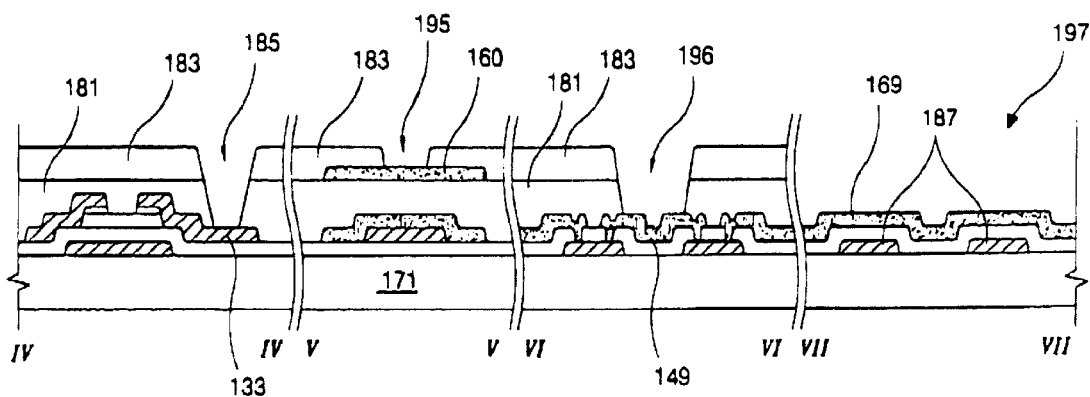

Referring now to FIG. 4 and FIG. 5E, a drain contact hole 185 that exposes the drain electrode 133 is formed by etching through the second insulation layer 183 and the protection layer 181. Simultaneously, a capacitor electrode contact hole 195 to the second capacitor electrode 160 is formed by etching through the second insulation layer 183. Also simultaneously, an etching hole 196 to the island-shaped transparent electrode pattern is formed by etching through the second insulation layer 183 and the protection layer 181. Moreover, the etch stopper 169 is exposed by etching the second insulation layer 183 and the protection layer 181 such that an etch stopper contact hole 197 is formed.

Figure 5F:
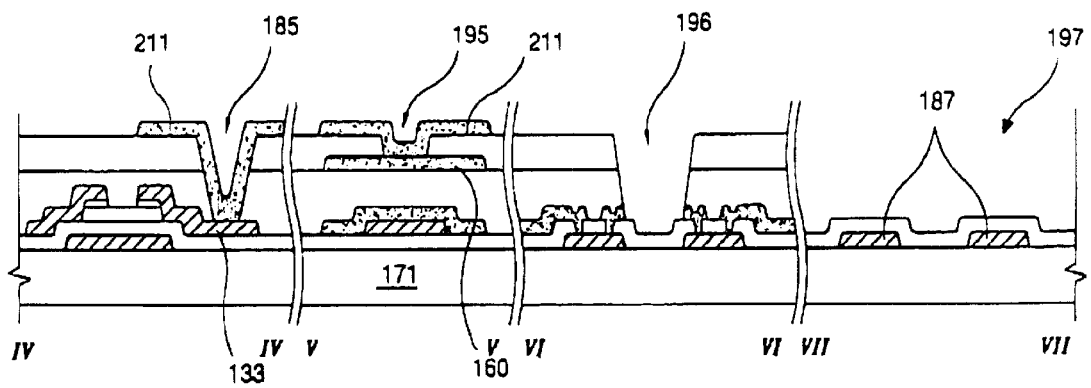

Referring now to FIG. 5F, a pixel electrode 211 is formed by depositing and patterning a transparent conductive material such as ITO (indium-tin-oxide) or IZO (indium-zinc-oxide). The pixel electrode 211 is formed in electrical contact with the drain electrode 133, via the drain contact hole 185, and with the second capacitor electrode 160, via the capacitor electrode contact hole 195. Thus, the pixel electrode 211 and the second capacitor electrode 160 have equipotentials. When forming the pixel electrode 211, the etch stopper 169 (see FIG. 5E) over the gate pads 187 is etched and the central portion of the island-shaped transparent electrode pattern 149 (see FIG. 5E) is also etched. After that, although not shown in FIG. 5F, but shown in FIG. 4, gate pad contact holes to the gate pads are formed by etching the first insulation layer.

Accordingly, in the illustrated embodiment of the present invention, since the gate lines are electrically connected to the island-shaped transparent electrode pattern through the gate line contact holes during dry etching, gate line open-circuits caused by the discharge of static electricity generated during dry etching are prevented. Charges are distributed and the plural gate lines have equipotentials. Therefore, the manufacturing yield is raised, and the manufacturing defect caused in the array substrate is decreased. The throughput of the array substrate is also increased.

Other embodiments and features of the invention will be apparent to the skilled in the art from consideration of the specification and practice of the invention disclosed herein. It is intended that the specification and examples be considered as exemplary only, with the true scope and spirit of the invention being indicated by the following claims.

What is claimed is:

1. An array substrate comprising:
    a plurality of gate lines on a substrate, each gate line having a gate electrode, a gate pad, and a gate line extension;
    a first insulation layer over said plurality of gate lines, over said gate electrodes, over said gate line extensions, and over said substrate;
    a plurality of gate line contact holes, each gate line contact hole passing through said first insulation layer to said gate line extension;
    a plurality of thin film transistors on said first insulation layer, each thin film transistor located over a gate electrode and having a source electrode, a drain electrode, and a semiconductor layer;
    a plurality of data lines on said first insulation layer, each data line electrically connecting to a plurality of source electrodes, wherein said plurality of data lines cross said plurality of gate lines to define a plurality of pixel regions;
    a ground line under each pixel region, said ground line being on said first insulation layer;
    a first capacitor electrode over said ground line and over a portion of said first insulation layer, said first capacitor electrode electrically connecting to said ground line, wherein said first capacitor electrode is comprised of a transparent conductive material;
    an electrode pattern over said gate lines extensions and contacting a plurality of said gate line extensions via said gate line contact holes; and
    an etch stopper on said first insulation layer and over said gate pads.

2. An array substrate according to claim 1, further including:
    a protection layer over said thin film transistor, over said first capacitor electrode, over said transparent electrode pattern, and over said etch stopper;
    a second capacitor electrode on said protection layer and over said first capacitor electrode;
    a second insulating layer over said protection layer and over said second capacitor electrode;
    a plurality of etching holes, each passing through said second insulation layer and through said protection layer to said electrode pattern; and
    a plurality of etch stopper contact holes, each passing through said second insulation layer and through said protection layer to said etch stopper.

3. An array substrate according to claim 2, further including a capacitor electrode contact hole through said second insulation layer to said second capacitor electrode.

4. An array substrate according to claim 2, further including a drain electrode contact hole through said second insulation layer and through said protection layer to a first drain electrode of said plurality of drain electrodes.

5. An array substrate according to claim 4, including a pixel electrode, wherein said pixel electrode electrically contacts said drain electrode through said drain electrode contact hole.

6. An array substrate according to claim 1, wherein said gate line extension extends from said gate line in a longitudinal direction.

7. An array substrate according to claim 1, wherein said electrode pattern is transparent.

8. An array substrate according to claim 7, wherein said electrode pattern is island-shaped.

9. An array substrate according to claim 1, wherein said electrode pattern electrically connects said gate lines together.

* * * * *